United States Patent [19]

Sumi

[11] 4,088,959
[45] May 9, 1978

[54] MULTIPLE-BAND DIGITAL FREQUENCY SYNTHESIZER RECEIVER

[75] Inventor: Yasuaki Sumi, Tottori, Japan

[73] Assignees: Sanyo Electric Co., Ltd., Moriguchi; Tottori Sanyo Electric Co., Ltd., Tottori, both of Japan

[21] Appl. No.: 682,832

[22] Filed: May 4, 1976

[30] Foreign Application Priority Data

May 30, 1975 Japan .................................. 50-65938

[51] Int. Cl.$^2$ ............................................ H04B 1/32
[52] U.S. Cl. ..................................... 325/459; 325/470
[58] Field of Search ............... 325/335, 419, 453, 458, 325/459, 464, 468, 470; 334/15; 331/1 A, 4, 18, 25

[56] References Cited

U.S. PATENT DOCUMENTS

| 3,803,494 | 4/1974 | Howell et al. ........................ 325/469 |
| 3,961,261 | 6/1976 | Pflasterer ............................. 325/470 |
| 3,962,644 | 6/1976 | Baker .................................... 325/459 |

OTHER PUBLICATIONS

"A Frequency Synthesizer for Television Receivers'-'—Eric Breeze, Aug. 1974—Fairchild Journal of Semiconductor Progress, vol. 2, #8, pp. 3-8.

Primary Examiner—Robert L. Griffin
Assistant Examiner—Marc E. Bookbinder
Attorney, Agent, or Firm—Darby & Darby

[57] ABSTRACT

A frequency synthesized multi-band receiver having a phase locked loop (PLL) including a voltage controlled oscillator (VCO) for producing the local oscillator frequency. The PLL includes a programmable divider for dividing the output of the VCO for comparison with a reference frequency in a phase detector to produce a voltage for controlling the output frequency of the VCO. Memory means are provided for storing information concerning the upper and lower frequency limits of the bands over which the receiver is to operate.

13 Claims, 5 Drawing Figures

MULTIPLE-BAND DIGITAL FREQUENCY SYNTHESIZER RECEIVER

BACKGROUND OF THE INVENTION

1. Field of the Invention

The present invention relates to a multiple-band digital frequency synthesizer receiver. More specifically, the present invention relates to a multiple-band receiver employing a digital frequency synthesizer employing a phase locked loop.

2. Description of the Prior Art

A typical prior art radio receiver comprises as a local oscillator for a tuner a parallel resonance circuit comprising a coil and a capacitor, in which the inductance of the coil or the capacitance of the capacitor is varied to obtain a desired tuning frequency. However, such a local oscillator is liable to suffer from fluctuations of the oscillation frequency caused by temperature characteristics of the coil, capacitor and the other oscillator components. Thus, it is rather difficult to obtain a stabilized oscillation frequency.

A digital frequency synthesizer has also been proposed and in practical use. Such a frequency synthesizer is much more advantageous in that it can provide a much more stabilized oscillation frequency. A typical frequency synthesizer employs a phase locked loop, which is often simply referred to as "PLL".

A frequency synthesizer employing a phase locked loop usually comprises a voltage controlled oscillator the oscillation frequency of which is controllable as a function of an output voltage, as low pass filtered, obtainable from a phase detector, which is adapted to compare the phase or the frequency of the output from a reference oscillator and the phase or the frequency of an output from a programmable frequency divider adapted to frequency divide the output frequency from the said voltage controlled oscillator at the frequency division rate which is adapted to be variable as a function of a control signal. Automatic scanning of the oscillation frequency of the output from the said voltage controlled oscillator is effected by varying the said control signal and thus the frequency division rate of the programmable frequency divider. Therefore, if such a voltage controlled oscillator is used as a local oscillator of a tuner of a radio receiver, automatic scanning of the receiving band can be effected by varying the frequency division rate of the programmable frequency divider, as described above. If and when the frequency of a broadcasting station is tuned by the tuner, an output is obtained by the receiver, which is utilized to disable the variation of the said control signal.

The variable range of the frequency division rate of the programmable frequency divider sould be determined depending on the range of the local oscillation frequency of the local oscillator for a given receiving band, such as an AM medium wave band, AM short wave band, band and, or the like and the frequency difference between the adjacent two broadcasting station frequencies, such that the receiver can receive any broadcasting frequency of the said given receiving band. Thus, it is appreciated that the variable range of the frequency division rate of the programmable frequency divider sould be different depending on the receiving band. For example, the Japanese standard for FM broadcasting has been determined as a range of receiving frequencies from 76 through 90 MHz, an intermediate frequency of 10.7 MHz, and an inter-station frequency of 100 KHz. This means that the local oscillation frequency should be varied from 65.3 through 79.3 MHz, assuming that a lower sideband superheterodyne is employed. Accordingly, it is necessary that the frequency division rate of the programmable frequency divider be variable from 653 to 793. On the other hand, the Japanese standard for AM medium wave broadcasting has been determined as the range of receiving frequencies from 535 through 1605 KHz, an intermediate frequency of 455 KHz and an inter-station frequency of 10 KHz. This means the local oscillation frequency should be varied from 990 to 2060 KHz and accordingly the frequency division rate of the programmable frequency divider need be varied from 99 to 206, assuming that an upper sideband superheterodyne is employed.

Assuming that the receiving band is switched from a state of receiving FM broadcasting to a state of receiving AM broadcasting, the difference between the variable range of the frequency division rate of the programmable frequency divider for reception of FM broadcasting and the variable range of the frequency division rate of the programmable frequency divider for reception of AM broadcasting makes impossible the reception of AM broadcasting because of the receiving frequency in such a situation being outside of the range of the receiving band of AM broadcasting, if and when a receiver designed for reception for FM broadcasting is simply utilized for reception of AM braodcasting, and vice versa. Thus, in implementing a multiple-band radio receiver, it is necessary to provide a multiple number of frequency synthesizers each of which is adapted for reception of the corresponding broadcasting band. However, provision of a multiple number of frequency synthesizers makes the structure of the receiver complicated. It is desired that a multiple-band receiver with simplified structure be provided. Further it is desired that a multiple-band receiver is provided in which automatic scanning of the receiving band is effected from either the minimum or the maximum frequency of the receiving band when the receiving band is switched.

SUMMARY OF THE INVENTION

Briefly stated, the present invention comprises a superheterodyne receiver, comprising means for receiving a high frequency signal, local oscillating means for providing an oscillation frequency signal the frequency of which is different by a given frequency difference from said received high frequency signal, and mixing means responsive to said received high frequency signal and said local oscillation frequency signal for providing an intermediate frequency signal; said local oscillating means comprising voltage controlled oscillating means for providing an oscillation frequency signal the oscillation frequency of which is variable as a function of a given control voltage, means for modifying the oscillation frequency of the output from said voltage controlled oscillating means, means for controlling the rate of frequency modification of said oscillation frequency modifying means, and means responsive to the output from said oscillation frequency modifying means, as modified at the frequency modification rate controlled by said frequency modification rate controlling means, for providing a control voltage associated with the frequency of the output from said oscillation frequency modifying means to said voltage controlled oscillating means, whereby said local oscillating means is adapted to provide a local oscillation frequency signal the frequency of which is associated with the frequency modification rate, as controlled by said frequency modification rate controlling means, said receiver further comprising means for selecting a plurality of receiving frequency bands and means responsive to the output from said band selecting means for accommodating the control of the frequency modification rate by said frequency modification rate controlling means for enabling reception of the frequencies in the corresponding receiving band.

In the preferred embodiment of the present invention, the said accommodating means comprises means for storing information concerning the frequency range of said plurality of receiving frequency bands and means responsive to the band selecting output from said band selecting means for defining the variation range of said frequency division rate controlling means with said information concerning the frequency range of the corresponding receiving frequency band.

Therefore, it is a principal object of the present invention to provide an improved multiple-band receiver having a digital frequency synthesizer employing a phase locked loop, wherein the said frequency synthesizer is adaptably controlled to be capable of receiving the frequencies in the corresponding band in response to a band selecting signal.

It is another object of the present invention to provide an improved multiple-band receiver having a digital frequency synthesizer employing a phase locked loop, in which the maximum and minimum frequencies in the corresponding receiving band to be received by the receiver are controllably defined in response to a band selecting signal.

It is a further object of the present invention to provide an improved multiple-band receiver having a digital frequency synthesizer employing a phase locked loop, in which the maximum and minimum frequencies in the corresponding receiving band are controllably defined in response to a band selecting signal and scanning of the band for tuning to a broadcasting wave by the receiver is adapted to be started from a predetermined one of the maximum and minimum frequencies in the corresponding receiving band in response to the band selecting signal by way of an initial condition.

These objects and other objects, features, aspects and advantages of the present invention will be better understood from the following detailed description of the preferred embodiment of the present invention when taken in conjunction with the accompanying drawings.

Figure 1:
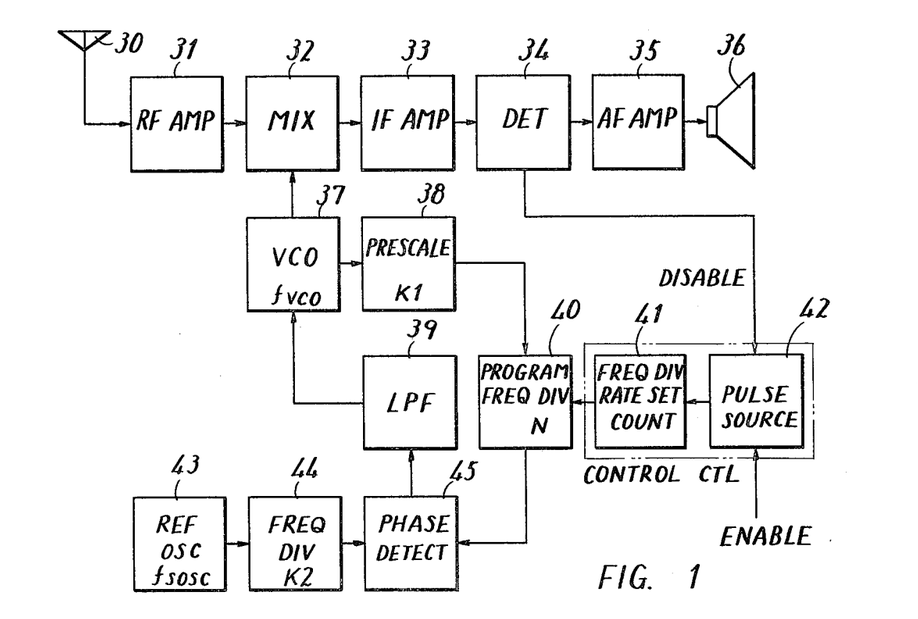
FIG. 1 is a block diagram of a radio receiver having a typical digital frequency synthesizer employing a phase locked loop, in which the present invention can be advantageously employed.

DESCRIPTION OF THE PREFERRED EMBODIMENTS:

FIG. 1 is a block diagram of a radio receiver having a typical digital frequency synthesizer employing a phase locked loop, in which the present invention can be advantageously employed. The receiver shown comprises an antenna 30 for receiving a broadcasting wave, a radio frequency amplifier 31 for amplifying the received broadcasting wave, a mixer 32 for mixing the radio frequency output from the amplifier 31 with a local oscillation frequency output to be described subsequently for providing an intermediate frequency output, an intermediate frequency amplifier 33 for amplifying the intermediate frequency output from the mixer 32, a detector 34 for detecting the intermediate frequency output from the amplifier 33 for providing an audio frequency output, an audio frequency amplifier 35 for amplifying the audio frequency output from the detector 34, and a loud speaker 36 for transducing the audio frequency output from the amplifier 35 into a sound output. The mixer 32 is connected to receive a local frequency output from a voltage controlled osillator 37 which serves as a local oscillator. The voltage controlled oscillator 37 is structured such that the oscillation frequency thereof is varied as a function of a control voltage applied thereto. In the receiver shown, such a control voltage is provided as an output from a phase detector 45, as filtered by means of a low pass filter 39. The phase detector 45 is connected to receive, at one input thereto, an output from a frequency divider 44, which is connected to receive an output from a reference oscillator 43. The phase detector 45 is also connected to receive, at the other input thereto, an output from a programmable frequency divider 40, which typically comprises a programmable counter. The programmable frequency divider 40 is connected to receive a pulse output from a prescaler 38 for the purpose of counting the number of pulses at the programmed rate and is also connected to receive a control signal from a control CTL for the purpose of controlling the said programmed rate. The prescaler 38 comprises a frequency divider for frequency dividing the output from the voltage controlled oscillator 37. The control CTL comprises a frequency division rate setting counter 41 for providing a set control signal to the programmable frequency divider 40 for setting the rate of counting by the counter 40 and a pulse source 42 for providing pulses to the setting counter 41. The pulse source 42 is adapted to start providing pulses to the counter 41 in response to an enable signal such as an input signal for starting automatic scanning of the receiving band for the purpose of tuning to a broadcasting station. The pulse source 42 is also adapted to stop providing pulses to the counter 41 in response to a disable signal which is obtainable if and when the receiver is tuned to a given broadcasting station frequency and an output is obtained from the detector 34, whereby a state of receiving the said broadcasting station frequency is established.

For the purpose of describing the operation of the FIG. 1 receiver, it is assumed that the oscillation frequency of the reference oscillator 43 is fsosc, the oscillation frequency of the voltage controlled oscillator 37 is fvco, the rate of frequency division by the prescaler 38 is 1/K1, the rate of frequency division by the frequency divider 44 is 1/K2, and the rate of frequency division by the programmable frequency divider 40 is 1/N. Then the following equation is obtained.

$$fsosc \cdot 1/K2 = 1/N \cdot 1/K1 \cdot fvco \qquad (1)$$

In general, in this type of frequency synthesizer, the relation $K1 = K2$ is adopted. Therefore, the equation (1) may be expressed as follows.

$$fsosc = fvco \cdot 1/N \qquad (2)$$

Accordingly, the following equation is obtained.

$$fvco = N \cdot fsosc \qquad (3)$$

where $N$ is an integral number.

By way of an example, assuming that $fsosc = 100$ KHz and $N = 718$, then $fvco = 71.8$ MHz is obtained from the equation (3). Therefore, further assuming that a receiving frequency high is 82.5 MHz, these frequencies are applied to the mixer 32, whereby an intermediate frequency of 10.7 MHz is obtained, if and when a lower sideband superheterodyne is adopted, with the result that an FM broadcasting wave of 82.5 MHz can be received. Thus, variation of frequency division rate N of the programmable frequency divider on a one-by-one basis from 653 to 793 enables reception of the frequencies of the stations at the interval of 100 KHz from 76.0 MHz to 90.0 MHz.

Various data concerning reception of the FM broadcasting wave in accordance with the Japanese standard are listed in the following.

| | | | |
|---|---|---|---|
| Range of FM frequencies | 76.0 MHz | ~ | 90.0 MHz. |
| Intermediate frequency | 10.7 MHz | ~ | 10.7 MHz |
| Range of oscillation frequency | 65.3 MHz | ~ | 79.3 MHz |
| Output from prescaler (1/100 FREQ. DIV) | 653 KHz | ~ | 793 KHz |
| Range of counts by setting counter 41 | 653 | ~ | 793 | where a lower side superheterodyne is adopted and the reference frequency is 1 KHz, with the result that a count of one by the setting counter 41 corresponds to the inter-station frequency of 100 KHz.

Similarly, the data concerning reception of an AM broadcasting wave in accordance with the Japanese standard are listed in the following.

| | | | |
|---|---|---|---|
| Range of AM frequencies | 535 KHz | ~ | 1605 KHz |
| Intermediate frequency | 455 KHz | ~ | 455 KHz |
| Range of local oscillation frequency | 990 KHz | ~ | 2060 KHz |
| Range of counts by setting counter 41 | 990 | ~ | 2060 | where the upper sideband superheterodyne is adopted, the reference frequency is 1 KHz and the inter-station frequency is 10 KHz.

As seen from the equation (3), the oscillation frequency fvco of the voltage controlled oscillator 37, i.e. the local oscillation frequency, is the integral number $N$ times the reference oscillation frequency fsosc of the reference oscillator 43, which usually comprises a crystal oscillator. Thus, it is appreciated that the frequency synthesizer of this type can be controlled in accordance with the stability and the precision of the oscillation frequency of a crystal oscillator and a radio receiver of high stability and precision of a local oscillation frequency can be provided.

As described previously, a problem arises in implementing a radio receiver employing a digital frequency synthesizer which is capable of being switched to a plurality of receiving bands. Therefore, the present invention comprises an improvement in the control CTL in the FIG. 1 receiver.

Figure 2:
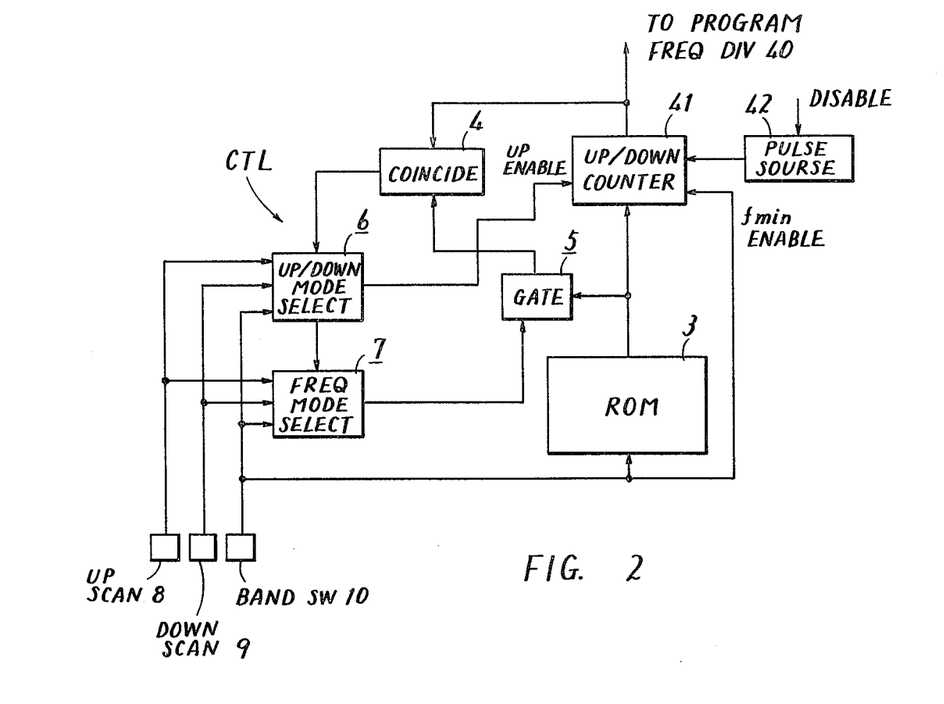
FIG. 2 is a block diagram of the control CTL employing the present invention.

FIG. 2 is a block diagram of the control CTL employing the present invention. The setting counter 41 of the control CTL comprises an up/down counter which is connected to receive the pulses from the pulse source 42 and to provide the set count output to the programmable frequency divider 40. In addition, the up/down counter 41 is structured such that it is controlled to be operative as an up counter upon receipt of an "up enable" mode selecting input while it is controlled to be operative as a down counter in the absence of the "up enable" input thereto. The up/down counter 41 is further structured such that it is intially preset to store the initial set count corresponding to the minimum frequency $f_{min}$ of a given band as a function of an "$f_{min}$ enable" input thereto. Such an initial set count corresponding to the minimum frequency of a given receiving band is selectively obtained from a read only memory ROM 3, which stores the respective initial set counts corresponding to the maximum and minimum frequencies $f_{max}$ and $f_{min}$, respectively, of a plurality of receiving bands. The read only memory 3 is structured such that it is responsive to a band selecting signal to selectively provide the said respective initial set counts corresponding to the maximum and minimum frequencies $f_{max}$ and $f_{min}$, respectively, of the corresponding receiving band. The output from the read only memory 3, as selectively read out, is also applied through a gate 5 to a coincidence circuit 4, which receives as another input thereto the output from the up/down counter 41, thereby to evaluate coincidence of the outputs from the read only memory 3 and the up/down counter 41. The coincidence output from the coincidence circuit 4 is applied to an up/down mode selecting circuit 6, which is responsive to an output from any one of an upward scanning switch 8, a downward scanning switch 9 and an output from a band selecting switch 10 to provide the said "up enable" signal to the up/down counter 41. The gate 5 serves to selectively pass therethrough either the count corresponding to the maximum frequency $f_{max}$ or the minimum frequency $f_{min}$ in a given receiving band to the coincidence circuit 4 in response to a frequency mode selecting signal obtainable from a frequency mode selecting circuit 7. The frequency mode selecting circuit 7 is structured to be responsive to the output from the upward scanning switch 8, downward scanning switch 9 and band selecting switch 10 and the upward/downward mode select output from the upward/downward mode selecting circuit 6 to provide the said frequency mode selecting signal. More specifically, the frequency mode selecting circuit 7 is structured such that it provides a maximum frequency selecting signal at the time of upward scanning and at the time of band switching and provides a minimum frequency selecting signal at the time of downward scanning, whereby the set count corresponding to the maximum frequency and the set count corresponding to the minimum frequency, respectively, in a given receiving band are selectively allowed to pass through the gate 5 to the coincidence circuit 4.

In operation, if and when the upward scanning switch 8 or the downward scanning switch 9 is depressed, while the band switch is depressed to select a desired one of a plurality of receiving bands, the read only memory 3 is controlled to provide the count values corresponding to the maximum frequency and the minimum frequency of the said desired receiving band and the up/down mode selecting circuit 6 and the frequency mode selecting circuit 7 are controlled to be in the upward scanning mode, so that the up/down mode selecting circuit 6 provides the up enable signal to the up/down counter 41, while the frequency mode selecting circuit 7 provides the maximum frequency selecting signal to the gate 5. As a result, the said desired receiving band is scanned in the upward direction to reach the maximum frequency of the said receiving band, when the coincidence output is obtained from the coincidence circuit 4, which reverses the state in the up/down mode selecting circuit 6 and the frequency mode selecting circuit 7. Therefore, the up enable signal is not obtained any more from the up/down mode selecting circuit 6 and the minimum frequency mode selecting signal is obtained from the frequency mode selecting circuit 7. As a result, the up/down counter 41 is made to operate as a down counter, while the count value corresponding to the minimum frequency is applied through the gate 5 to the coincidence circuit 4. Thus, the receiving band is scanned this time in the downward direction. If and when the minimum frequency is reached again, the coincidence output is obtained from the coincidence circuit 4 and accordingly the up/down mode selecting circuit 6 and the frequency mode selecting circuit 7 are brought to be in a reversed state. Therefore, the upward scanning of the receiving band is regained and thereafter the above described operation is repeated.

Figure 3:
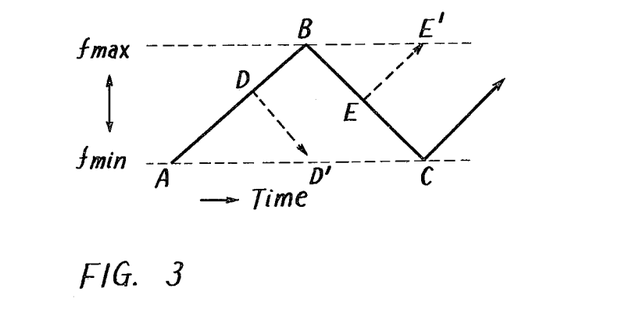
FIG. 3 is a graph showing a relation of the frequency and the time, in which the ordinate indicates frequency and the abscissa indicates time.

FIG. 3 is a graph showing a relation of frequency and time, in which the ordinate indicates the frequency and the abscissa indicates the time.

Figure 4:
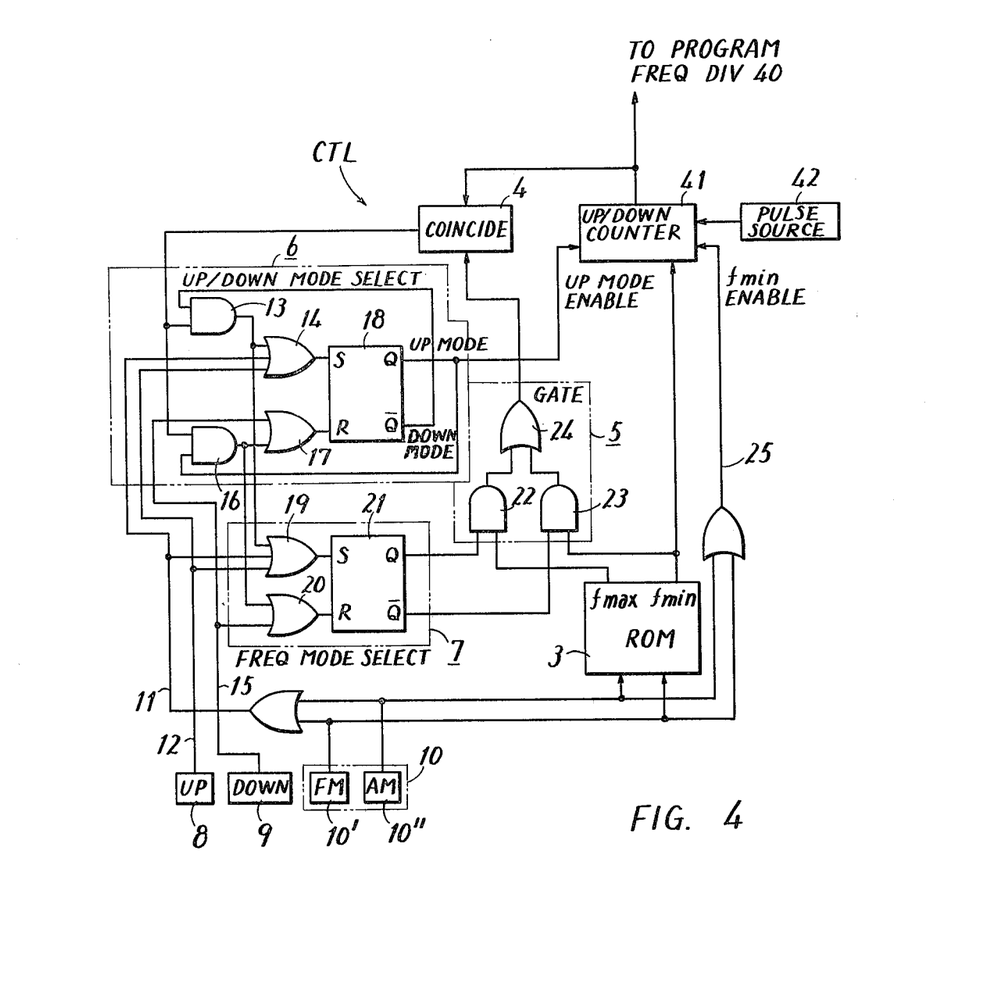
FIG. 4 is a more detailed block diagram of the control CTL of the FIG. 1 receiver.

FIG. 4 is a more detailed block diagram of the control CTL of the FIG. 1 receiver. The up/down mode selecting circuit 6 comprises a flip-flop 18. The set input to the flip-flop 18 is connected from the output of an OR gate 14. One input to the OR gate 14 is connected through a line 11 from an output of an OR gate inputs of which are connected individually to an FM band selecting switch 10' and an AM band selecting switch 10", which were generally denoted by the reference numeral 10 in FIG. 2. Another input to the OR gate 14 is connected through a line 12 from the upward scanning switch 8. A further input to the OR gate 14 is connected to the output 13 of an AND gate 13. One input to the AND gate 13 is connected from the reset output Q of the flip-flop 18, which represents the downward scanning mode. Another input to the AND gate 13 is connected to receive the coincidence output from the coincidence circuit 4. The reset input of the flip-flop 18 is connected from the output of an OR gate 17. One input to the OR gate 17 is connected through a line 15 to the downward scanning switch 9. Another input to the OR gate 17 is connected from the output of an AND gate 16. One input to the AND gate 16 is connected to receive the set output Q of the flip-flop 18, which represents the upward scanning mode. Another input to the AND gate 16 is connected to receive the coincidence output from the coincidence circuit 4. Thus, it is appreciated that the flip-flop 18 is set if and when the band selecting signal is received through the line 11 from either the band selecting switch 10' or 10", the upward scanning signal is received through the line 12 from the upward scanning switch 8 or the coincidence output is received from the coincidence circuit 4 while the control CTL is in the downward scanning mode, i.e. the reset output Q is obtained from the flip-flop 18. On the other hand, the flip-flop 18 is reset, if and when the downward scanning signal is received through the line 15 from the downward scanning switch 9 or the coincidence output is obtained from the coincidence circuit 4 while the control CTL is in the upward scanning mode, i.e. the set output Q is obtained from the flip-flop 18. The set output of the flip-flop 18 is applied to the up/down counter 41 as the up mode enable signal, whereby the up/down counter 41 is made to operate as an up counter. In the absence of the up mode enable signal applied to the counter 41, i.e. if and when the flip-flop 18 is reset, the up/down counter 41 is controlled to operate as a down counter.

The frequency mode selecting circuit 7 also comprises a flip-flop 21. The set input to the flip-flop 21 is connected from the output of an OR gate 19. One input to the OR gate 19 is connected to receive the upward scanning signal through the line 12 from the upward scanning switch 8. Another input to the OR gate 19 is connected to receive through the line 11 the band selecting signal from either the FM band selecting switch 10' or the AM band selecting switch 10" through an OR gate 14a. A further input to the OR gate 19 is connected to receive the output from the AND gate 13. The reset input to the flip-flop 21 is connected from the output of an OR gate 20. One input to the OR gate 20 is connected to receive through the line 15 the downward scanning signal from the downward scanning switch 9. Input to the OR gate 20 is connected to receive the output from the AND gate 16. Thus, it is appreciated that the flip-flop 21 is set, if and when the band selecting signal is received through the line 11 from either the FM band selecting switch 10' or the AM band selecting switch 10", the upward scanning signal is received through the line 12 from the upward scanning switch 8, or the coincidence output is obtained from the coincidence circuit 4 while the control CTL is in the downward scanning mode, i.e. the flip-flop 18 is reset. On the other hand, the flip-flop 21 is reset, if and when the downward scanning signal is received through the line 15 from the downward scanning switch 9 or the coincidence output is obtained from the coincidence circuit 4 while the control CTL is in the upward scanning mode i.e. the flip-flop 18 is set. The set output of the flip-flop 21 is connected to one input to an AND gate 22 and the reset output from the flip-flop 21 is connected to one input to an AND gate 23. Another input to the AND gate 22 is connected to receive the preset count value or data concerning the maximum frequency of the read only memory 3 and another input to the AND gate 23 is connected to receive the preset count value or data concerning the minimum frequency of the read only memory 3. The outputs from the AND gates 22 and 23 are connected to the inputs to an OR gate 24 and the output from the OR gate 24 is connected to one input to the coincidence circuit 4. The output of the data concerning the minimum frequency of the read only memory 3 is also connected to the data input to the up/down counter 41 for the purpose of setting the data concerning the minimum frequency as an initial setting data. The band selecting outputs from the FM band selecting switch 10' and the AM band selecting switch 10" are connected through an OR gate 14b to the up/down counter 41 as the fmin enable signal, thereby to enable the said data concerning the minimum frequency obtainable from the read only memory 3 to be loaded in the up/down counter as an initial setting data.

Now, operation of the control CTL shown in FIG. 4 will be described in the following. First let it be assumed that the FM and selecting switch 10' has been depressed and accordingly the receiver comprising the control CTL in FIG. 4 is in the state of receiving the FM broadcasting wave. Accordingly, the read only memory 3 is responsive to the FM band selecting signal from the switch 10' to be controlled to provide the data concerning the maximum and minimum frequencies of the FM band. If it is desired to effect upward scanning toward the maximum frequency in such a situation, the upward scanning switch 8 is manually operated, whereby the flip-flop 18 of the up/down mode selecting circuit 6 is set and the upward scanning mode is established. In such a situation the up/down counter 41 is made to operate as an up counter. At the same time the flip-flop 21 of the frequency mode selecting circuit 7 is also set, whereby the maximum frequency mode is established. In such a situation the AND gate 22 is enabled, whereby the data concerning the maximum frequency of 90 MHz is provided from the read only memory 3 to the coincidence circuit 4. The up/down counter 41 for setting the frequency division rate makes up count upon receipt of each pulse from the pulse source 42, thereby to start scanning from the point A toward the point B, as shown in FIG. 3. If and when the broadcasting wave is received by the receiver shwon in FIG. 1 in the course of the upward scanning, the output is obtained from the detector 34 and accordingly the pulse source 42 is disabled, with the result that no more pulses are applied to the up/down counter 41 and thus the state of receiving the broadcasting wave is maintained. If and when the maximum frequency of 90 MHz at the point B is reached, the coincidence output is obtained from the coincidence circuit 4, whereby the AND gate 16 is enabled and the flip-flop 18 is reset. Accordingly, the up/down mode selecting circuit 6 is switched to the downward scanning mode and accordingly the up/down counter 41 is also switched to operate as a down counter. The flip-flop 21 is also reset and accordingly the frequency mode selecting circuit 7 is also switched to the minimum frequency mode, whereby the minimum frequency of 76 MHz is applied from the read only memory 3 through the AND gate 23 and the OR gate 24 to the coincidence circuit 4. The up/down counter 41 is made this time to count down the pulses from the pulse source 42, thereby to make the downward scanning from the point B toward the point C. If and when the minimum frequency at the point C is reached, the said two flip-flops 18 and 21 are reversed. Thus, scanning of the frequency band is automatically reversed if and when the minimum frequency or the maximum frequency is reached.

If and when the downward scanning switch 9 is operated at the point D in FIG. 3 in the course of the upward scanning, the flip-flops 18 and 21 are forcibly reset, whereby the downward scanning is started in the direction D' as shown in the dotted line in FIG. 3. If and when the upward scanning switch 8 is operated at the point E in the course of the downward scanning, the upward scanning is started in the direction E' in the similar manner. Thus, it is appreciated that the direction of the scanning can be changed as desired by selective operation of the upward and downward scanning switches 8 and 9 in the course of scanning.

If and when the band switching is made from FM to AM, the band switching signal obtainable through the line 11 from the band selecting switch 10 makes the flip-flop 18 of the up/down mode selecting circuit 6 and the flip-flop 21 of the frequency mode selecting circuit 7 be set, thereby to establish the upward scanning mode and the maximum frequency mode, respectively. Accordingly, the up/down counter 41 for setting the frequency division rate is controlled to operate as an up counter and the data concerning the maximum frequency in the AM band (1605 KHz) is provided from the read only memory 3 to the coincidence circuit 4. At the same time, the up/down counter 41 is responsive to the AM band selecting signal obtainable through the line 25 to load therein the data concering the minimum frequency of the AM band (535 KHz) obtainable from the read only memory 3. Therefore, as the pulses are applied to the up/down counter 41 from the pulse source 42, the scanning is started in the upward scanning direction from the minimum frequency of 535 KHz of the AM band.

Although the embodiment described in the foregoing was adapted to make upward scanning, starting from the minimum frequency of the corresponding band based on the data as loaded in the up/down counter 41 from the read only memory 3 at the time of the band switching, alternatively the data concerning the maximum frequency in the corresponding band may be loaded in the up/down counter 41 from the read only memory 3, so that the downward scanning may be effected in response to the band switching.

Figure 5:
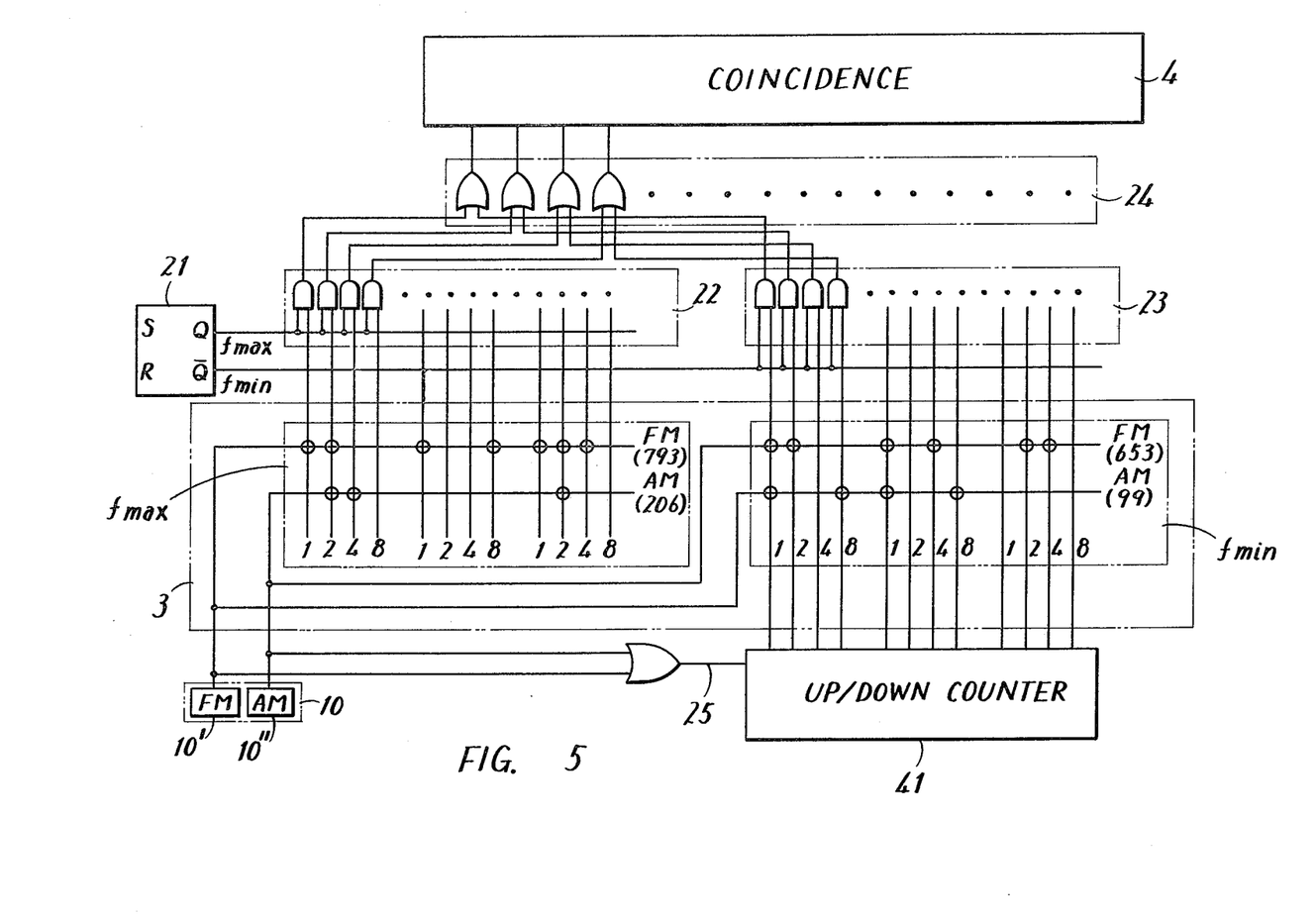
FIG. 5 is a more detailed block diagram of the read only memory 3 of the FIGS. 2 and 4 control.

FIG. 5 is a more detailed block diagram of the read only memory 3 in the FIGS. 2 and 4 control. The data concerning the maximum and minimum frequencies in each of the receiving bands each comprises, at the largest, a three-digit binary coded decimal value corresponding thereto. Thus, the read only memory 3 is shown comprising three sets of column signal lines in each of a maximum frequency region $f_{max}$ and a minimum frequency region $f_{min}$, with each of sets of column line signals comprising four column signal lines corresponding to the bit positions of each digit. The maximum frequency region $f_{max}$ comprises an FM selecting row line connected to the FM selecting switch 10' and an AM selecting row signal line connected to the AM selecting switch 10''. Similarly, the minimum frequency region $f_{min}$ comprises an FM selecting row signal line connected to the FM selecting switch 10' and an AM selecting row signal line connected to the AM selecting switch 10''. With particular reference to the maximum frequency region $f_{max}$ of the read only memory 3, only the intersections marked by a circle between the column and row signal lines comprise interconnections for encoding the three-digit binary coded decimal value corresponding to the maximum frequencies in the respective receiving bands. More specifically, the said interconnections marked by a circle each comprise a diode connected from the row signal line to the column signal line with the proper polarity to conduct when the row line receives a signal. As a result, if and when the FM selecting switch 10' is depressed, the FM row selecting row signal line is brought to the high level and accordingly only the column signal lines with the said interconnections provided are brought to the high level, thereby to provide a three-digit binary coded decimal value corresponding to the maximum frequency in the FM band. Since the value corresponding to the maximum frequency in the AM band and the minimum frequencies in the FM and AM bands are also similarly obtained, a further description will be omitted. The AND gate 22 comprises three sets of AND gates, each set corresponding to the digit and comprising four bit AND gates, one of the inputs to these AND gates being connected to receive the set output from the flip-flop 21 and the other inputs to these AND gates being connected to receive the corresponding bit column signal lines in the maximum frequency region $f_{max}$ of the read only memory 3. Similarly the AND gate 23 comprises three sets of AND gates, each set corresponding to the digit and comprising four AND gates, one of the inputs to these AND gates being connected to receive the reset output from the flip-flop 21 and the other of the inputs to these AND gates being connected to the corresponding bit column signal lines in the minimum frequency region $f_{min}$ of the read only memory 3. The column signal lines in the minimum frequency region $f_{min}$ of the read only memory 3 are also connected in the parallel manner to the up/down counter 41, such that the three-digit binary coded decimal value represented by the column signal lines can be loaded in the counter 41 in a parallel manner in response to the band selecting signal obtainable at the line 25. The outputs from the AND gates in the blocks 22 and 23 are connected through OR gates in the block 24 to the coincidence circuit 4 in a parallel manner. Thus, it is appreciated that if and when the FM selecting switch 10' is depressed, the FM selecting row lines in the maximum and minimum frequency regions $f_{max}$ and $f_{min}$ are brought to the high level and accordingly the three-digit binary coded decimal values coded by the interconnections marked by a circle corresponding to the maximum and minimum frequencies in the FM band are applied in a parallel manner to the AND gates 22 and 23. Therefore, if and when the flip-flop 21 is set, only the AND gates in the block 22 are enabled and accordingly only the three-digit binary coded value corresponding to the maximum frequency in the FM band is applied through the block 24 to the coincidence circuit 4. On the other hand, if and when the flip-flop 21 is reset, only the AND gates in the block 23 are enabled and accordingly only the three-digit binary coded decimal value corresponding to the minimum frequency in the FM band is applied through the OR gates in the block 24 to the coincidence circuit 4 in a parallel manner. If and when the AM selecting switch 10" is depressed, similarly only the three-digit binary coded decimal value corresponding to the maximum or minimum frequency in the AM band is selectively applied through the block 24 to the coincidence circuit 4 in a parallel manner depending on the storing state of the flip-flop 21.

Although this invention has been described and illustrated in detail, it is to be clearly understood that the same is by way of illustration and example only and is not to be taken by way of limitation, the spirit and scope of this invention being limited only by the terms of the appended claims.

What is claimed is:

1. A superheterodyne receiver, comprising means for receiving a high frequency signal in each of a plurality of receiving frequency bands, local oscillating means for providing an oscillation frequency signal the frequency of which is different by a given frequency difference from said received high frequency signal, and mixing means responsive to said received high frequency signal and said local oscillation frequency signal for providing an intermediate frequency signal; said local oscillating means comprising voltage controlled oscillating means for providing said local oscillation frequency signal the oscillation frequency of which is variable as a function of a given control voltage, means for modifying the oscillation frequency of the output from said voltage controlled oscillating means by dividing the frequency of the output from said voltage controlled oscillating means, first means for varying the amount of frequency modification of said oscillation frequency modifying means by varying the division ratio of said modifying means, means responsive to the output from said oscillation frequency modifying means as controlled by said first means for providing said control voltage for said voltage controlled oscillating means, whereby said local oscillating means is adapted to provide a local oscillation frequency signal the frequency of which is associated with the frequency division ratio as controlled by said first means, means for storing information concerning the frequency range of each of said plurality of receiving frequency bands, means for selecting one of a plurality of receiving frequency bands, means responsive to the operation of said frequency band selecting means setting the information from said storing means concerning the frequency range of a selected band into said first means for defining one boundary of the variation of the division ratio of said oscillating frequency modifying means thereby enabling reception of the frequencies in the corresponding selected receiving band, means for providing a signal representative of a predetermined tuning state of the frequency of the signal received by said high frequency signal receiving means of said receiver, means for commanding a tuning operation by said receiver, said first means including means responsive to the output from said tuning operation commanding means to vary the frequency division ratio of said oscillation frequency modifying means in a given direction and responsive to said signal representative of the predetermined tuning state of said receiver means to discontinue the variation of said frequency division ratio produced by said first means.

2. A superheterodyne receiver in accordance with claim 1, wherein said control voltage providing means comprises means for providing a reference frequency signal, and means responsive to the output from said oscillation frequency modifying means and the output from the said reference frequency signal providing means for detecting the frequency difference between the frequency of the output from said oscillation frequency modifying means and the frequency of said reference frequency signal for providing said control voltage to said voltage controlled oscillating means.

3. A superheterodyne receiver, comprising means for receiving a high frequency signal in each of a plurality of receiving frequency bands, local oscillating means for providing an oscillation frequency signal the frequency of which is different by a given frequency difference from said received high frequency signal, and mixing means responsive to said received high frequency signal and said local oscillation frequency signal for providing an intermediate frequency signal; said local oscillating means comprising voltage controlled oscillating means for providing said local oscillation frequency signal the oscillation frequency of which is variable as a function of a given control voltage, means for modifying the oscillation frequency of the output from said voltage controlled oscillating means by dividing the frequency of the output from said voltage controlled oscillating means, first means for varying the amount of frequency modification of said oscillating frequency modifying means by varying the division ratio of said modifying means, means responsive to the output from said oscillation frequency modifying means as controlled by said first means for providing said control voltage for said voltage controlled oscillating means, whereby said local oscillating means is adapted to provide a local oscillation frequency signal the frequency of which is associated with the frequency division ratio as controlled by said first means, means for storing information concerning the extremities of the boundaries of the frequency range of each of said plurality of receiving frequency bands, means for selecting one of a plurality of receiving frequency bands, means responsive to the operation of said frequency band selecting means setting the information from said storing means concerning the extremities of the boundaries of the frequency range of a selected band into said first means for defining the boundaries of the variation of the division ratio of said oscillating frequency modifying means thereby enabling reception of the frequencies in the corresponding selected receiving band, said defining means further comprising means responsive to said information concerning said one and the other extremity boundary frequencies of the corresponding selected receiving frequency band and responsive to the output from said first means for terminating the variation of the frequency division ratio when the ratios reach the respective values corresponding to said one and the other extremity frequency boundaries of the corresponding selected receiving frequency band, means for providing a signal representative of a predetermined tuning state of the frequency of the signal received by said high frequency signal receiving means of said receiver, and means for commanding a tuning operation by said receiver, said first means further comprising means responsive to said command output from said tuning operation commanding means to enable the variation of the frequency division ratio of said oscillation frequency modifying means in a given direction and responsive to said signal representative of the predetermined tuning state of said receiver means to discontinue the variation of said frequency division ratio produced by said first means.

4. A superheterodyne receiver in accordance with claim 3 in which said command means comprises means for commanding an upward variation of the local oscillation frequency signal, and means for commanding a downward variation of the local oscillation frequency signal, and said first means further comprises reversible variation means responsive to said upward variation command to cause an upward variation of the frequency division ratio and responsive to said downward variation command to cause a downward variation of the frequency division ratio.

5. A superheterodyne receiver in accordance with claim 4, in which said means for modifying the oscillation frequency further comprises state store means responsive to said upward variation command for assuming a first store state and responsive to the downward variation command for assuming a second store state, and said first means being responsive to the first state store output from said state store means for causing the upward variation and responsive to the second store state output from said state store means for causing the downward variation.

6. A superheterodyne receiver in accordance with claim 5, in which said state store means is responsive to the termination of the variation of the division ratio by said first means in the upward direction for assuming a second store state and responsive to the termination of the variation in the downward direction for assuming the first store state.

7. A superheterodyne receiver, comprising means for receiving a high frequency signal in each of a plurality of receiving frequency bands, local oscillating means for providing an oscillation frequency signal the frequency of which is different by a given frequency difference from said received high frequency signal, and mixing means responsive to said received high frequency signal and said local oscillation frequency signal for providing an intermediate frequency signal; said local oscillating means comprising voltage controlled oscillating means for providing said local oscillation frequency signal the oscillation frequency of which is variable as a function of a given control voltage, means for modifying the oscillation frequency of the output from said voltage controlled oscillating means by dividing the frequency of the output from said voltage controlled oscillating means, first means for varying the amount of frequency modification of said oscillation frequency modifying means by varying the division ratio of said modifying means, means responsive to the output from said oscillation frequency modifying means as controlled by said first means for providing said control voltage for said voltage controlled oscillating means, whereby said local oscillating means is adapted to provide a local oscillation frequency signal the frequency of which is associated with the frequency division ratio as controlled by said first means, means for storing information concerning the extremities of the boundaries of the frequency range of each of said plurality of receiving frequency bands, means for selecting one of a plurality of receiving frequency bands, means responsive to the operation of said frequency band selecting means setting the information from said storing means concerning the extremities of the boundaries of the frequency range of a selected band into said first means for defining boundaries of the variation of the division ratio of said oscillating frequency modifying means thereby enabling reception of the frequencies in the corresponding selected receiving band, said defining means further comprising means responsive to said information concerning said one and the other extremity boundary frequencies of the corresponding selected receiving frequency band and responsive to the output from said first means for terminating the variation of the frequency division ratio when the ratios reach the respective values corresponding to said one and the other extremity frequency boundaries of the corresponding selected receiving frequency band, said means modifying the oscillation frequency further comprising state store means responsive to said band selecting means for assuming a first store state and responsive to said variation terminating means for assuming a second store state, and said defining means being responsive to the first store state output from said state store means for causing the variation of the frequency division ratio.

8. A superheterodyne receiver, comprising means for receiving a high frequency signal in each of a plurality of receiving frequency bands, local oscillating means for providing an oscillation frequency signal the frequency of which is different by a given frequency difference from said received high frequency signal, and mixing means responsive to said received high frequency signal and said local oscillation frequency signal for providing an intermediate frequency signal; said local oscillating means comprising voltage controlled oscillating means for providing said local oscillation frequency signal the oscillation frequency of which is variable as a function of a given control voltage, means for modifying the oscillation frequency of the output from said voltage controlled oscillating means by dividing the frequency of the output from said voltage controlled oscillating means, first means for varying the amount of frequency modification of said oscillation frequency modifying means by varying the division ratio of said modifying means in a given direction, means responsive to the output from said oscillation frequency modifying means as controlled by said first means for providing said control voltage for said voltage controlled oscillating means, whereby said local oscillating means is adapted to provide a local oscillation frequency signal the frequency of which is associated with the frequency division ratio as controlled by said first means, means for storing information concerning the frequency range of each of said plurality of receiving frequency bands, means for selecting one of a plurality of receiving frequency bands, means responsive to the operation of said frequency band selecting means setting the information from said storing means concerning the frequency range of a selected band into said first means for defining the variation of the division ratio of said oscillating frequency modifying means in said given direction thereby enabling reception of the frequencies in the corresponding selected receiving band, means for commanding a tuning operation by said receiver, said information concerning the band frequency range obtainable from said storing means comprising information concerning one extremity frequency of the respective selected receiving frequency band, said defining means comprising means responsive to the band selecting output from said band selecting means for initially setting said information concerning said one extremity frequency of the corresponding receiving frequency band in said first means, and said first means comprising means responsive to said command output from said tuning operation commanding means to enable the variation of the frequency division ratio of said first means in a given direction to effect a scanning operation of the band frequency range.

9. A superheterodyne receiver in accordance with claim 8, in which said information concerning the band frequency range obtainable from said storing means further comprises information concerning the other extremity frequency of the respective selected receiving frequency band, and said defining means further comprises means responsive to said information concerning said one and the other extremity frequencies of the corresponding selected receiving frequency band and respective to the output from said first means for terminating the variation of the frequency division ratio when the variation of the frequency division ratio reaches the respective values corresponding to said one and the other extremity frequencies of the corresponding selected receiving frequency band.

10. A superheterodyne receiver in accordance with claim 9 which further comprises:

means for providing a signal representative of a predetermined tuning state of the frequency of the signal received by said high frequency signal receiving means of said receiver, and said first means further comprising means responsive to said command output from said tuning operation commanding means to enable the variation of the frequency division ratio of said oscillation frequency modifying means in a given direction and responsive to said signal representative of the predetermined tuning state of said receiver means to discontinue the variation of said frequency division ratio produced by said first means.

11. A superheterodyne receiver in accordance with claim 10 in which said command means comprises means for commanding an upward variation of the local oscillation frequency signal, and means for commanding a downward variation of the local oscillation frequency signal, and said first means further comprises reversible variation means responsive to said upward variation command to cause an upward variation of the frequency division ratio and responsive to said downward variation command to cause a downward variation of the frequency division ratio.

12. A superheterodyne receiver in accordance with claim 11, in which said means for modifying the oscillation frequency further comprises state store means responsive to said upward variation command for assuming a first store state and responsive to the downward variation command for assuming a second store state, and said first means being responsive to the first state store output from said state store means for causing the upward variation and responsive to the second store state output from said state store means for causing the downward variation.

13. A superheterodyne receiver in accordance with claim 12, in which said state store means is responsive to the termination of the variation division ratio by said first means in the upward direction for assuming a second store state and responsive to the termination of the variation in the downward direction for assuming the first store state.

* * * * *